United States Patent
Miyazaki

(10) Patent No.: US 10,109,776 B2
(45) Date of Patent: Oct. 23, 2018

(54) LIGHT EMITTING DEVICE HAVING CURVED LIGHT EMITTING ELEMENT

(71) Applicant: NICHIA CORPORATION, Anan-shi (JP)

(72) Inventor: Masaya Miyazaki, Anan-shi (JP)

(73) Assignee: NICHIA CORPORATION, Anan-shi (JP)

( * ) Notice: Subject to any disclaimer, the term of this patent is extended or adjusted under 35 U.S.C. 154(b) by 84 days.

(21) Appl. No.: 14/794,815

(22) Filed: Jul. 9, 2015

(65) Prior Publication Data

US 2016/0013375 A1 Jan. 14, 2016

(30) Foreign Application Priority Data

Jul. 9, 2014 (JP) .................................. 2014-141227

(51) Int. Cl.
| | | |
|---|---|---|
| *H01L 33/54* | (2010.01) | |
| *H01L 33/24* | (2010.01) | |
| *H01L 33/56* | (2010.01) | |
| *H01L 33/62* | (2010.01) | |
| *H01L 33/00* | (2010.01) | |

(52) U.S. Cl.
CPC .............. *H01L 33/54* (2013.01); *H01L 33/24* (2013.01); *H01L 33/56* (2013.01); *H01L 33/62* (2013.01); *H01L 33/0079* (2013.01); *H01L 2224/1403* (2013.01); *H01L 2224/14051* (2013.01); *H01L 2224/16225* (2013.01);
(Continued)

(58) Field of Classification Search
CPC ......... H01L 33/24; H01L 33/56; H01L 33/54; H01L 33/62; H01L 2224/14051; H01L 2224/1403; H01L 2224/32225; H01L 2224/16225; H01L 2924/3511; H01L 2224/73204; H01L 33/0079
See application file for complete search history.

(56) References Cited

U.S. PATENT DOCUMENTS

| | | | |
|---|---|---|---|
| 2004/0072383 A1 | 4/2004 | Nagahama et al. | |
| 2010/0231422 A1* | 9/2010 | Inaba ...................... | G06F 3/045 341/20 |

(Continued)

FOREIGN PATENT DOCUMENTS

| | | |
|---|---|---|
| JP | 2003-258301 | 9/2003 |
| JP | 2004-266240 | 9/2004 |

(Continued)

*Primary Examiner* — Marcia Golub-Miller
(74) *Attorney, Agent, or Firm* — Mori & Ward, LLP

(57) ABSTRACT

A light emitting device includes a substrate, a light emitting element, and an insulating resin member. The light emitting element has an upper surface and a lower surface opposite to the upper surface and is provided on the substrate so that the lower surface faces the substrate. The insulating resin member is provided between the light emitting element and the substrate and includes a first resin member and a second resin member. The first resin member is provided in a first region. The second resin member is provided in a second region different from the first region and has hardness different from hardness of the first resin member. A height from the substrate to the upper surface of the light emitting element facing the first resin member is different from a height from the substrate to the upper surface of the light emitting element facing the second resin member.

4 Claims, 4 Drawing Sheets

(52) U.S. Cl.
CPC ............ *H01L 2224/32225* (2013.01); *H01L 2224/73204* (2013.01); *H01L 2924/3511* (2013.01)

(56) References Cited

U.S. PATENT DOCUMENTS

2012/0276354 A1\* 11/2012 Thompson ............... C08J 5/128
 428/217
2013/0170165 A1\* 7/2013 Sakurai ................. H01L 21/563
 361/768

FOREIGN PATENT DOCUMENTS

| | | |
|---|---|---|
| JP | 2007-273574 | 10/2007 |
| JP | 2012-156443 | 8/2012 |

\* cited by examiner

LIGHT EMITTING DEVICE HAVING CURVED LIGHT EMITTING ELEMENT

CROSS-REFERENCE TO RELATED APPLICATIONS

The present application claims priority under 35 U.S.C. § 119 to Japanese Patent Application No. 2014-141227, filed Jul. 9, 2014. The contents of this application are incorporated herein by reference in their entirety.

BACKGROUND

Technical Field

The present disclosure relates to a light emitting device.

Discussion of the Background

Such a surface mount light emitting devices has been known that has a structure in which a light emitting element such, for example, as a light emitting diode (LED) or a laser diode (LD) is mounted on a substrate. This light emitting device is used for luminaires, backlight sources for various display screens of mobile personal computers, smartphones, thin-screen televisions or the like, light sources for vehicles, light sources for display devices, and light sources for other general consumer products. In order to improve the light extraction efficiency, such a light emitting device is used that has a structure in which a positive electrode and a negative electrode are disposed on one surface side. Also, a generally proposed structure of the light emitting device is that a light emitting element is flip chip mounted on an insulating substrate having formed thereon a wiring pattern.

Recently, higher power light sources have been demanded, and efforts have been made to increase the size (area) of each light emitting device or to increase the number of mounting light emitting elements to satisfy the demand.

As a method for solving the above-described problems, such a method is known that improves the light extraction efficiency by removing the growth substrate with a UV laser beam application after the flip chip mounting process, as disclosed, for example, in Japanese Patent Laid-Open Publication No. 2012-156443.

Also, it has been known to adjust the light distribution of a light emitting element itself by, for example, providing a diffusion member on the light emitting element.

SUMMARY OF THE INVENTION

According to one aspect of the present invention, a light emitting device includes a substrate, a light emitting element, and an insulating resin member. The light emitting element has an upper surface and a lower surface opposite to the upper surface and is provided on the substrate so that the lower surface faces the substrate. The insulating resin member is provided between the light emitting element and the substrate and includes a first resin member and a second resin member. The first resin member is provided in a first region. The second resin member is provided in a second region different from the first region and has hardness different from hardness of the first resin member. A height from the substrate to the upper surface of the light emitting element facing the first resin member is different from a height from the substrate to the upper surface of the light emitting element facing the second resin member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
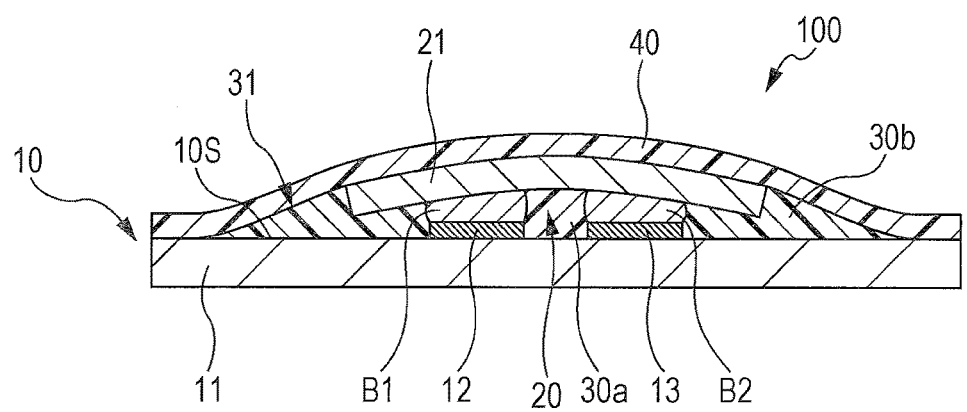
FIG. 1 is a schematic sectional view showing a configuration of a light emitting device.

The embodiments will now be described with reference to the accompanying drawings, wherein like reference numerals designate corresponding or identical elements throughout the various drawings.

Hereinafter, embodiments of the present invention will be described with reference to the drawings. In the accompanying drawings, like or similar parts are referred to by like or similar reference numerals. However, the drawings are schematic, and, in some cases, a dimensional ratio between parts may be different from an actual dimensional ratio. Accordingly, actual dimensions of each part should be understood by referring to the following description. It should also be understood that a dimensional relationship or ratio between different figures may sometimes be different from an actual relationship or ratio.

First Embodiment

1. Configuration of a Light Emitting Device 100

A configuration of a light emitting device 100 in accordance with the present embodiment will be described with reference to the drawings. FIG. 1 is a schematic sectional view showing a configuration of the light emitting device 100.

The light emitting device 100 includes a substrate 10, a light emitting element 20, and a resin member 30. The resin member 30 is disposed between the substrate 10 and the light emitting element 20. The resin member 30 includes a first resin member 30a and a second resin member 30b that is disposed in a region different from a region in which the first resin member 30a is disposed. Also, the first resin member 30a is different in hardness from the second resin member 30b. A height of an upper surface of the light emitting element from the substrate at a part above the first resin member 30a is different from a height of the upper surface of the light emitting element from the substrate at a part above the second resin member 30b.

In the first embodiment, the height of the upper surface of the light emitting element from the substrate is higher at a central region of the light emitting element than at a peripheral region of the light emitting element. In other words, the upper surface of the light emitting element has a protruded shape (a convex surface) in which the center of the upper surface is the highest portion. In more detail, as shown in FIG. 1, the first resin member 30a is formed below the central region of the light emitting element, and the second resin member 30b is formed below the peripheral region of the light emitting element. The height of the upper surface of the light emitting element 20 from the substrate is higher at the part above the first resin member 30a than at the part above the second resin member 30b. This makes it possible to widen the distribution of the light emitted from the light emitting element, compared to the structure in which there is no height difference on the upper surface of the light emitting element. The height difference on the upper surface of the light emitting element between the parts which are respectively located above the first and second resin members 30a and 30b increases in proportion to the hardness difference between the first and second resin members 30a and 30b. The increased height difference on the upper surface of the light emitting element means that the upper surface of the light emitting element has a convex shape with a smaller radius of curvature.

In the case where the upper surface of the light emitting element is a curved surface as described above, the "heights of the upper surface of the light emitting element from the substrate" means "an average height of the upper surface of the light emitting element at the part above the first resin member 30a from the substrate" and "an average height of the upper surface of the light emitting element at the part above the second resin member 30b from the substrate", respectively. Although a difference in the heights between the part above the first resin member 30a and the part above the second resin member 30b are described above, the two parts may have a same height at the border therebetween because both of the two parts are located on the upper surface of the light emitting element. Further, "heights of the upper surface of the light emitting element from the substrate" particularly refers to heights of the upper surface of the light emitting element from an upper surface of the substrate, on which the wiring electrodes are provided.

The resin member 30 may preferably be formed to be in contact with a part or whole of at least one side surface of the light emitting element 20 so as to cover the side surface of the light emitting element 20, and may more preferably be formed to be in contact with the light emitting element 20 so as to surround the whole circumference of the light emitting element 20.

Substrate

The substrate 10 is a base material of the light emitting element, and includes a substrate body 11, an n-side wiring electrode 12, and a p-side wiring electrode 13.

The shape of the substrate 10 may not be limited to a particular shape, and may be a shape corresponding to the shape of the substrate body 11. For example, the shape of the substrate 10 may be a circle, a polygon such, for example, as a quadrangle, or a shape similar to these.

The thickness of the substrate 10 can be adjusted by the thickness of the substrate body 11. For example, the thickness of the substrate 10 at the thickest part may preferably be equal to or smaller than approximately 1000 μm, and may more preferably be equal to or smaller than approximately 500 μm. Also, the thickness may preferably be equal to or larger than approximately 40 μm.

Substrate Body

The substrate body 11 may, for example, be a metal, a ceramic, a resin, an insulator, a pulp, a glass, a paper, or a composite material of two or more of these (e.g., a composite resin), or may be a composite material of one of these materials and an electrically conductive material (e.g., a metal, a carbon, or the like), or the like. The metal may include copper, iron, nickel, chrome, aluminum, silver, gold, titanium, or an alloy of one or more of these. The ceramic may contain aluminum oxide, aluminum nitride, zirconium oxide, zirconium nitride, titanium oxide, titanium nitride, or a mixture of two or more of these. The composite resin may be a glass epoxy resin or the like. The resin may be an epoxy resin, a bismaleimide triazine (BT) resin, a polyimide resin, a cyanate resin, a polyvinyl acetal resin, a phenoxy resin, an acrylic resin, an alkyd resin, a urethane resin, or the like.

Wiring Electrode

The n-side wiring electrode 12 and the p-side wiring electrode 13 are disposed on an upper surface 10S of the substrate 10. The n-side wiring electrode 12 and the p-side wiring electrode 13 are respectively connected to wiring electrodes for external connection.

In a case where the substrate body is made of a ceramic or a glass epoxy, metal films produced by plating, sputtering, vapor deposition, or the like may be used for the wiring electrodes. In a case where the substrate body is a resin, a lead frame may be used as the wiring electrodes. In the case where the wiring electrodes are metal films formed, for example, by plating or the like, the thickness of each wiring electrode may be in a range from several μm to several tens of μm.

The substrate 10 may further include a heat dissipation terminal, a heat sink, a reinforcing member, or the like, in addition to the wiring electrodes electrically connected to the light emitting element 20.

For example, the wiring electrodes can be formed of a single-layer or laminated film of Au, Pt, Pd, Rh, Ni, W, Mo, Cr, Ti, Fe, Cu, Al, Ag, or the like, or an alloy of two or more of these. Among these, such a material is preferable that is excellent in electrical conductivity and mountability, and such a material is more preferable that is excellent in bondability and wettability to a bonding member on the side being mounted. Particularly, copper or a copper alloy is preferable from the view point of the heat dissipating property. The surface of the wiring electrodes may be coated with a coating film that has a high light reflectivity, such, for example, as a single-layer or laminated film of silver, platinum, tin, gold, copper, or rhodium, or an alloy of two or more of these. Specifically, the wiring electrodes may have a laminated structure of W/Ni/Au, W/Ni/Pd/Au, W/Ni/Co/Pd/Au, Cu/Ni/Cu/Ni/Pd/Au, Cu/Ni/Pd/Au, Cu/Ni/Au, Cu/Ni/Ag, Cu/Ni/Au/Ag, or the like. Also, the wiring electrodes may partially have a different thickness or a different number of laminated layers.

Light Emitting Element

The light emitting element 20 includes a semiconductor layer 21, and a p-side electrode and an n-side electrode that are formed on the semiconductor layer 21. In the present embodiment, the light emitting element is mounted on the substrate, and then the element substrate (a growth substrate of sapphire or the like) is removed from the light emitting element. A part of the element substrate may be left on the semiconductor layer. Further, since the element substrate is removed by being irradiated by a laser beam from the side of the element substrate after the light emitting element with the element substrate has been mounted on a substrate as will be described later, the element substrate may be light-transmissive so as to allow irradiation by a laser beam.

A single light emitting element 20 or a plurality of light emitting elements 20 may be mounted on a single light emitting device. The size, shape and the emission wavelength of the light emitting element 20 may be selected appropriately. In the case where a plurality of light emitting elements 20 are mounted on a single light emitting device, the light emitting elements may be arranged irregularly, or may be arranged regularly or periodically such, for example, as in a matrix. Also, the plurality of light emitting elements may be connected in series, parallel, series-parallel, or parallel-series.

The semiconductor layer 21 is disposed on a bump B1 and a bump B2 through electrodes formed on the semiconductor layer 21. The semiconductor layer 21 has an n-type semiconductor layer, an active layer, and a p-type semiconductor layer. The n-type semiconductor layer and the p-type semiconductor layer may be made, for example, of gallium nitride, aluminum gallium nitride, or aluminum nitride, or the like, but may not be limited to these. The active layer may be made, for example, of indium gallium nitride, but may not be limited to this. An n-side electrode is formed on the n-type semiconductor layer, and a p-type electrode is formed on the p-type semiconductor layer.

A shape in a planar view of the light emitting element may not be limited to a particular shape, but may preferably be a quadrangle (rectangle or square) or a shape similar to this. The maximum size of the light emitting element 20 can be appropriately adjusted depending on the size of the light emitting device. For example, a length of one side of a quadrangle-shaped light emitting element 20 can be approximately in a range from a hundred μm to 2 mm, and the size of the light emitting element 20 can preferably be, for example, about 1000 μm×1000 μm, about 1400 μm×1400 μm, or about 2000 μm×2000 μm.

The thickness of the light emitting element 20 including the electrodes may preferably be equal to or smaller than 200 μm, regardless of whether or not the light emitting element 20 includes the element substrate, and may more preferably be equal to or smaller than 180 μm, or even more preferably be equal to or smaller than 150 μm. The thickness of solely the semiconductor layer 21 from which an element substrate (a sapphire substrate) 50 has been removed can preferably be equal to or smaller than 20 μm, and more preferably be equal to or smaller than 15 μm, or even more preferably be equal to or smaller than 10 μm.

As shown in FIG. 1, the height of the light emitting element 20 in a sectional view varies with the distance from the center. The center is protruded. Heights of either all or a part of peripheral regions corresponding to the four sides of the light emitting element can be made lower than the height of the central region by appropriately disposing the later described resin members.

The light emitting element 20 can preferably be mounted on the substrate by the flip chip mounting method. In other words, it is preferable that a surface of the semiconductor layer opposite to a surface on which the electrodes are formed (from which the element substrate is removed) is made to be an upper surface, and this upper surface is made to be a light emitting surface. In this case, it is general that the electrodes formed on the side of the semiconductor layer 21 are bonded to the above-described wiring electrodes on the substrate with bonding members. The bonding members may be any of the bonding materials known in the art, and may be an electrically conductive bonding material. Specifically, materials that can be used for the bonding members include, for example, of the tin-bismuth-based, the tin-copper-based, the tin-silver-based, or the gold-tin-based solder (more specifically, an alloy mainly composed of Ag, Cu and Sn, an alloy mainly composed of Cu and Sn, an alloy mainly composed of Bi and Sn, or the like), an eutectic alloy (an alloy mainly composed of Au and Sn, an alloy mainly composed of Au and Si, an alloy mainly composed of Au and Ge, or the like), a conductive paste, a bump, or an anisotropic conductive material made of silver, gold, or palladium, or a brazing material such, for example, as a low melting temperature metal. Among these, use of the bumps is preferable to effectively produce a desired shape that will be described later.

Resin Member

The resin member 30 is disposed between the substrate 10 and the light emitting element 20, and is configured by at least two kinds of resin members which are different in hardness from each other. In the first embodiment, the first resin member 30a is harder than the second resin member 30b, and is disposed below the center of the light emitting element. The second resin member 30b is softer than the first resin member 30a, and is disposed below the peripheral region of the light emitting element. Also, the area of the first resin member 30a may preferably be equal to or smaller than the area of the second resin member 30b. By making the area of the first resin member 30a to be equal to or smaller than the area of the second resin member 30b, the upper surface of the light emitting element can be made to have a convex shape with a smaller radius of curvature, so that the light distribution range can be widened.

The resin member 30 can improve the strength of the light emitting element 20 in the process of removing (peeling off) the sapphire substrate 50 which will be described later. In addition, the resin member 30 can secure the strength of the entire light emitting device. It is possible by forming the bonding members of a material that is high in heat releasing property to improve the heat releasing property while maintaining the small-sized structure of the light emitting device.

The first resin member 30a may have a Shore hardness D of 40 or higher, and the second resin member 30b may preferably be softer than the first resin member 30a. It is preferable that the Shore hardness of the first resin member 30a is higher and that the Shore hardness of the second resin member 30b is lower, that is, the larger the difference between the first and second resin member in the Shore hardness, the preferable it is. As a hardness adjusting method, the hardness can be adjusted by adjusting the adding amount of the fillers.

Figure 6:
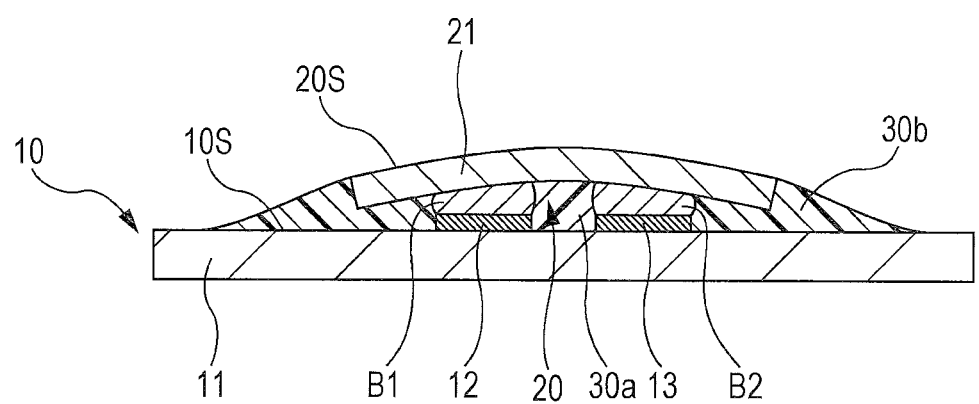
FIG. 6 is a schematic sectional view illustrating a method of manufacturing a light emitting device.

The first resin member 30a is disposed, in a top view ("a top view" is also referred to as "a plan view"), at approximately the center of the light emitting element 20, and is surrounded at its side by the second resin member 30b. The first resin member 30a and the second resin member 30b support the semiconductor layer 21 in a laser lift-off process of the sapphire substrate 50 that will be described later (FIG. 6). For this reason, it is preferable that the first resin member 30a and the second resin member 30b fill the space between the substrate 10 and the light emitting element 20. However, depending on an intended light distribution, a part of the peripheral region of the light emitting element may be filled with the second resin member 30b. For example, the second resin member 30b may be disposed at opposing two sides among the four sides of the light emitting element in plan view, that is, the second resin member 30b may be formed in two divided parts, and the first resin member 30a may be disposed between the two divided parts. In this case, the light emitting element 20 has, along one direction, a sectional shape in which the upper surface is curved. That is, the light emitting element has such a sectional plane that passes through the center in a direction (one direction) in which the second resin member, the first resin member and the second resin member are disposed in this order, and in this sectional plane, a shape in which the upper surface of the light emitting element is protruded at the center than at the periphery. On the other hand, a sectional plane that passes through the center of the light emitting element in a direction perpendicular to the above-mentioned one direction in the top view has no height difference on the upper surface, because only the first resin member is disposed in this sectional plane.

The second resin member 30b disposed below the peripheral region of the light emitting element 20 is disposed so as to be in contact with each of the side surfaces of the light emitting element 20, and is formed so as to become thinner (the width becomes thinner) as becoming farther from the substrate 10 (becoming upper) in the sectional view. Also, a top portion 31 of the second resin member 30b may preferably be at the same height as a light emitting surface 20S of the light emitting element 20, although it may be slightly higher or lower than this height. For example, in the case where the resin member 30 is formed so as to reach a height to cover the side surface of the element substrate (the sapphire substrate) 50 and then the sapphire substrate 50 is removed from the semiconductor layer 21, the top portion of the second resin member 30b may become higher than the upper surface (the light emitting surface 20S) of the light emitting element by an amount corresponding to the thickness of the sapphire substrate 50. In this case, the distance (height) from the light emitting surface 20S of the light emitting element 20 to the top portion 31 of the resin member 30 is about the same as the thickness of the sapphire substrate 50 that is to be removed, specifically in a range from 10 µm to 150 µm.

Each of the first resin member 30a and the second resin member 30b may contain at least one insulating material selected, for example, from a silicone resin, an epoxy resin and a fluorine resin, and may also contain an additive such as a filler or the like. Particularly, the silicone resin, which has a high heat resistance and a high light resistance, is preferable. To change the hardness, for example, the kind of the filler, the adding amount of the filler and the kind of the resin may be appropriately selected to obtain a desired hardness. The hardness can be increased by increasing the adding amount of the filler. Also, the light extraction efficiency of the light emitting device 100 can be improved by mixing a white filling material such, for example, as titanium oxide, silicon oxide, or alumina to the first resin member 30a or the second resin member 30b. Also, since the strength of the first resin member 30a and the second resin member 30b can be increased by the mixing of one or more of these additives, the strength of holding the semiconductor layer 21 can be increased during the later described process of lifting off the sapphire substrate 50 by a laser beam and after completion of the light emitting device 100. As a result, reliability can be improved when the substrate 10 is peeled off or when the light emitting device 100 is in use.

Sealing Member

A sealing member 40 is a member that covers light emitting element, the resin member 30 disposed below the light emitting device, and the upper surface of the substrate. In the case where the sealing member contains a phosphor material, color unevenness can be reduced by the sealing member 40 that is disposed, as described above, to cover not only the light extracting surface (the upper surface) of the light emitting element 20, but also a surface of the resin member 30b disposed in the peripheral region of the light emitting element 20. Also, a sealing member that does not contain a phosphor material (a clear layer) may be provided on the sealing member 40 that contains a phosphor material. The shape of the clear layer may not be limited to a particular shape, and may be, for example, a lens shape.

The thickness of the sealing member 40 may preferably be uniform on the upper surface (the light emitting surface 20S) of the light emitting element and on the resin member 30 disposed at the peripheral region of the light emitting element. Preferably, the thickness of the sealing member 40 may be in a range approximately from 5 µm to 50 µm. In the case where the resin member is disposed so as to cover the side surfaces of the light emitting element and the thickness of the resin member (the second resin member 30b) itself near its top portion 31 is thin, the sealing member 40 may preferably be formed thinly so as to allow the light extraction efficiency to be hardly reduced.

Bumps

Bumps B1 and B2 are members that electrically connect the light emitting element and the substrate, and that bond the light emitting element onto the substrate. Materials that can be used for the bumps include, for example, Au, Cu, Al, and the like. Preferably, a plurality of bumps B1 and B2 may be provided for each of the p-side wiring electrode and the n-side wiring electrode to stably connect the light emitting element and the substrate. Also, the height of each of the bumps B1 and B2 may be about several tens of µm.

2. Method of Manufacturing the Light Emitting Device 100

A method of manufacturing the light emitting device 100 will be described with reference to the drawings. FIGS. 2 to 6 are views illustrating a method of manufacturing the light emitting device 100.

First, the light emitting element 20 with the semiconductor layer 21 is prepared. The method of manufacturing light emitting device in accordance with the present embodiment includes a step of preparing a light emitting element. The step of preparing a light emitting element may be either a step of preparing a previously produced light emitting element or a step of producing a light emitting element.

Figure 2:
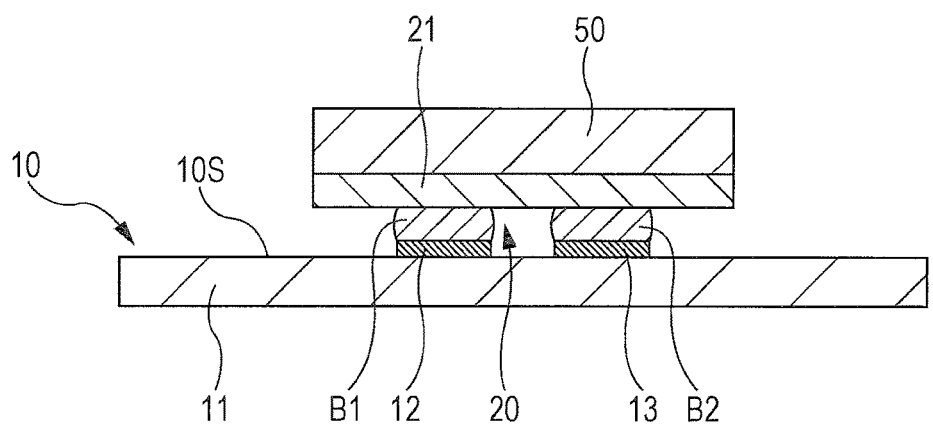
FIG. 2 is a schematic sectional view illustrating a method of manufacturing a light emitting device.

As shown in FIG. 2, the prepared light emitting element 20 is connected onto the substrate 10. In more detail, the n-side electrode of the light emitting element is connected to the n-side wiring electrode 12 on the substrate 10 via the bump B1, and the p-side electrode of the light emitting element is connected to the p-side wiring electrode 13 on the substrate 10 via the bump B2. The bumps B1 and B2 may be either disposed on the substrate 10 or disposed on the light emitting element 20. In the case of using a light emitting element 20 which has formed thereon bumps B1 and B2, a step of forming the bumps B1 and B2 can be omitted.

Figure 3:
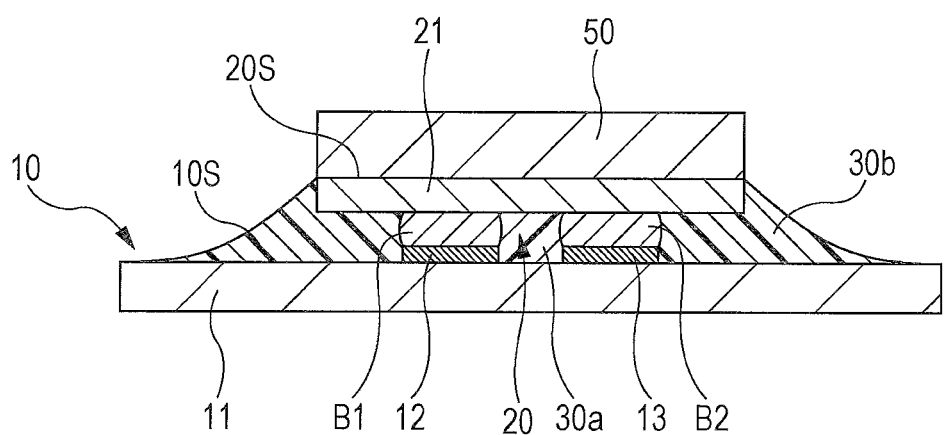
FIG. 3 is a schematic sectional view illustrating a method of manufacturing a light emitting device.

Next, as shown in FIG. 3, the first resin member 30a and the second resin member 30b are formed between the light emitting element 20 and the substrate 10 (below the light emitting element 20) by potting, printing, transfer molding, compression molding, or the like.

Figure 4:
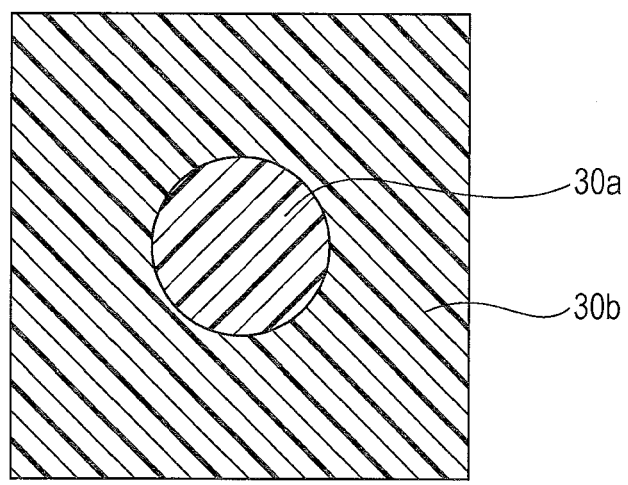
FIG. 4 is a schematic top view illustrating a method of manufacturing a light emitting device.
Figure 5:
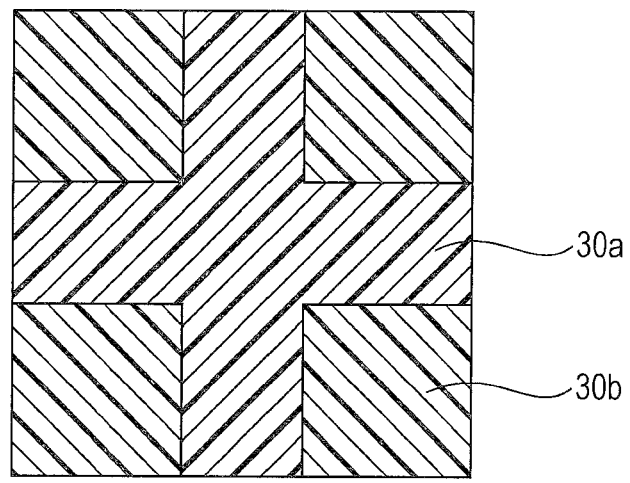
FIG. 5 is a schematic top view illustrating a method of manufacturing a light emitting device.

Each of FIGS. 4 and 5 is a top view of the light emitting element, in which description of the bumps and some other parts are omitted so that the regions where the first resin member and the second resin member are formed can be seen. FIG. 4 shows an example in which the first resin member 30a is disposed below the center of the light emitting element, and the second resin member 30b is disposed below the peripheral region of the light emitting element. In this example, the second resin member 30b is formed in substantially a ring shape so as to surround the circumference of the first resin member 30a which is formed in a circular shape. In the case of forming the first resin member 30a and the second resin member 30b by potting, as shown in FIG. 4, the first resin member 30a is formed to be located below the center of the light emitting element 20 by adjusting the viscosity and the amount of the resin material, and then the second resin member 30b is formed outside of the first resin member 30a so as to surround the first resin member 30a.

When the resin member 30 is formed, the light emitting element 20 has the element substrate (the sapphire substrate) 50. It is preferable to form the resin member 30 so as not to reach (creep up or extend to) the side surface of the element substrate. Also, since the sapphire substrate will be removed by being irradiated by a laser beam in the next step, it is preferable that the resin member 30 is not formed on the sapphire substrate disposed on the upper surface (the light emitting surface 20S) of the semiconductor layer.

Also, as shown in FIG. 5, the second resin member 30b may be formed at four corner parts among the peripheral regions of the light emitting element by adjusting the viscosity and the amount of the resin material, and then the first resin member 30a may be formed at the center. In FIG. 5, the second resin member 30b is formed so as to be divided into plural regions that are separated from one another. In other words, the first resin member 30a is in contact at a part of its periphery with the second resin member 30b, and reaches at the other part of its periphery below the periphery of the light emitting element.

Although the cases of using two kinds of resin members as shown in FIG. 4 and FIG. 5 have been described, the resin members may not be limited to two kinds, but may be more than two kinds. Also, the arrangement of the resin members may not be limited to the above-described arrangements.

Further, methods of forming the first resin member and the second resin member may be different from each other. For example, the first resin member 30a may be formed at the center of the light emitting element as shown in FIG. 4 by potting, and then the second resin member 30b may be formed by printing, transfer molding, compression molding, or the like. In the case of using this forming method, the second resin member 30b may be formed to cover the upper surface of the light emitting element 20. In this case, the upper surface of the element substrate on the light emitting element can be exposed later by removing a part of the resin member 30b by blasting or the like. In this manner, as shown in FIG. 3, the second resin member 30b is formed having a shape that is sloping from the upper surface of the substrate 10 to the side surface of the semiconductor layer 21, or in other words, a shape in which the width (thickness) becomes narrower as the height becomes higher.

Next, a laser beam (for example, a Nd:YAG laser or a KrF excimer laser) that passes through the element substrate (the sapphire substrate) 50 is applied from the upper surface side of the sapphire substrate 50, which is the side opposite to the surface on which the semiconductor layer 21 has been formed, to cause decomposition reaction at the boundary surface (the light emitting surface 20S) between the sapphire substrate 50 and the semiconductor layer 21 to separate the sapphire substrate 50 from the semiconductor layer 21. Due to the stress during the decomposition and the use of the two kinds of resin members, the light emitting element 20 becomes to have such a shape that is protruded at the center as shown in FIG. 6.

Next, the sealing member 40 is formed by a potting method, a compression molding method, a spray method, an injection molding method, or a printing method. The sealing member 40 may be formed of a material containing a phosphor material. In the manner as described above, the light emitting device 100 as shown in FIG. 1 can be completed.

Second Embodiment

Figure 7:
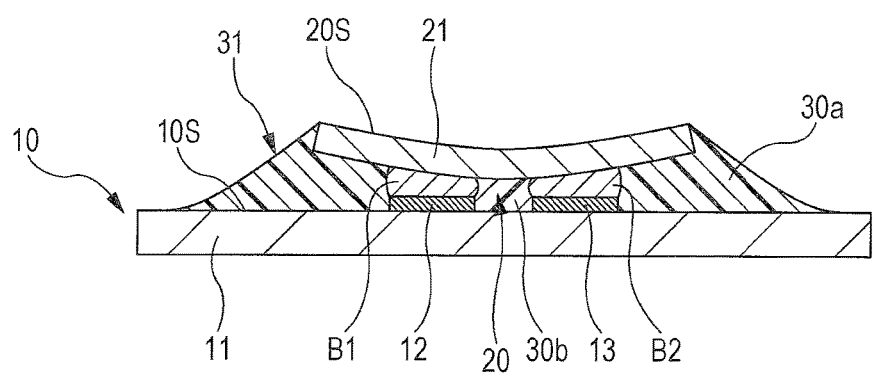
FIG. 7 is a schematic sectional view illustrating a method of manufacturing a light emitting device.

According to the second embodiment, the second resin member 30b is disposed, and then the first resin member 30a is disposed outside of the second resin member 30b. The first resin member 30a is harder than the second resin member 30b, and is disposed below the peripheral region of the light emitting element. The second resin member 30b is softer than the first resin member 30a, and is disposed below the center of the light emitting element. Also, a height of the upper surface of the light emitting element 20 from the substrate 11 at a part above the first resin member 30a is higher than a height of the upper surface of the light emitting element 20 at a part above the second resin member 30b. In other words, the light emitting element 20 has a concave shape as shown in FIG. 7. It is possible by taking this shape to narrow the light distribution of the emitting light from the light emitting element compared to a light emitting element that has its upper surface without any height difference.

A light emitting device of the embodiment of the present invention includes: a substrate; a light emitting element disposed on the substrate; and an insulating resin member disposed between the light emitting element and the substrate, wherein the resin member includes at least a first resin member and a second resin member that is disposed in a different region from a region in which the first resin member is disposed, wherein the first resin member and the second resin member are different in hardness from each other, and wherein a height of an upper surface of the light emitting element at a part above the first resin member is different from a height of the upper surface of the light emitting element at a part above the second resin member.

According to the embodiment of the present invention, it is possible to provide a light emitting device that can prevent reduction of the light extraction efficiency, and can adjust light distribution.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a substrate;
   a light emitting element having an upper surface and a lower surface opposite to the upper surface and provided on the substrate so that the lower surface faces the substrate, the light emitting element having a central region and a peripheral region surrounding the central region viewed in a plan view, the light emitting element having a curved shape such that a height from the substrate to the upper surface of the central region of the light emitting element is larger than a height from the substrate to the upper surface of the peripheral region of the light emitting element;
   a first electrode provided between the light emitting element and the substrate;
   a second electrode provided between the light emitting element and the substrate;
   an insulating resin member provided between the light emitting element and the substrate and comprising:
      a first resin member provided in a first region between the first electrode and the second electrode and between the substrate and the lower surface of the light emitting element in the central region of the light emitting element; and
      a second resin member provided in a second region between the substrate and the lower surface of the light emitting element in the peripheral region of the light emitting element, the first resin member being harder than the second resin member; and a sealing member covering the upper surface of the light emitting element, the second resin member, and the substrate.

2. The light emitting device according to claim 1, wherein the first resin member is provided at about a center of the light emitting element in a planar view, and wherein the second resin member is provided outside of the first resin member in the planar view.

3. The light emitting device according to claim 1, wherein the first resin member has an area that is equal to or smaller than an area of the second resin member in a planar view.

4. The light emitting device according to claim 1, wherein the sealing member contains a phosphor material.

* * * * *